(12) United States Patent
Kim et al.

(10) Patent No.: US 11,888,654 B2
(45) Date of Patent: Jan. 30, 2024

(54) OFFSET DETECTOR CIRCUIT FOR DIFFERENTIAL SIGNAL GENERATOR, RECEIVER, AND METHOD OF COMPENSATING FOR OFFSET OF DIFFERENTIAL SIGNAL GENERATOR

(71) Applicant: Samsung Electronics Co., Ltd., Suwon-si (KR)

(72) Inventors: Jueon Kim, Seoul (KR); Taehyoung Kim, Singapore (SG); Seungjin Park, Suwon-si (KR); Jihwan Hyun, Hwaseong-si (KR); Myoungbo Kwak, Seoul (KR); Junghwan Choi, Hwaseong-si (KR)

(73) Assignees: SAMSUNG ELECTRONICS CO., LTD., Suwon-si (KR); NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 17/898,851

(22) Filed: Aug. 30, 2022

(65) Prior Publication Data

US 2023/0171132 A1 Jun. 1, 2023

(30) Foreign Application Priority Data

Nov. 29, 2021 (KR) .......................... 10-2021-0167273
Apr. 5, 2022 (KR) .......................... 10-2022-0042073

(51) Int. Cl.
*H04L 25/03* (2006.01)
*H04L 27/06* (2006.01)
(Continued)

(52) U.S. Cl.
CPC .. *H04L 25/03006* (2013.01); *G01R 31/31703* (2013.01); *H03K 5/24* (2013.01);
(Continued)

(58) Field of Classification Search
CPC .... H04B 17/0085; H04B 17/21; H04B 17/22; H04B 17/25; H04L 25/03006;
(Continued)

(56) References Cited

U.S. PATENT DOCUMENTS 6,169,427 B1    1/2001 Brandt
6,356,218 B1 *  3/2002 Brown ................ H03M 1/1295
                                                    341/120
(Continued)

FOREIGN PATENT DOCUMENTS

KR    1020080028656 A    4/2008

OTHER PUBLICATIONS

Hyunsu Park, et al. "A 3-bit/2UI 27Gb/s PAM-3 Single-Ended Transceiver Using One-Tap DFE for Next-Generation Memory Interface", ISSCC 2019 / SESSION 23 / DRAM / 23.3.

*Primary Examiner* — Young T. Tse
(74) *Attorney, Agent, or Firm* — Muir Patent Law, PLLC

(57) ABSTRACT

An offset detector circuit includes a digital signal register storing M unit digital signals received in latest M signal periods, M being a natural number, among digital signals generated based on a single-ended PAM-N signal, N being an odd number, a comparator outputting a comparison signal of a pair of signals included in differential signals generated from a differential signal generator based on the single-ended PAM-N signal, a comparison result register storing M unit comparison signals corresponding to the latest M signal periods among the comparison signals, a pattern detector outputting a detection signal when the M unit digital signals match a predetermined signal pattern, and an offset checker checking patterns of the M unit comparison signals in response to the detection signal, and outputting an offset detection signal when the patterns of the M unit comparison signals match a predetermined offset pattern.

20 Claims, 17 Drawing Sheets

(51) Int. Cl.
*H03K 21/08* (2006.01)
*H03K 9/02* (2006.01)
*H04B 17/21* (2015.01)
*H03K 5/24* (2006.01)
*G01R 31/317* (2006.01)

(52) U.S. Cl.
CPC ............... *H03K 9/02* (2013.01); *H03K 21/08* (2013.01); *H04B 17/21* (2015.01); *H04L 27/06* (2013.01)

(58) Field of Classification Search
CPC ..... H04L 25/03057; H04L 27/06; H03K 9/02; H03K 21/08; G01R 31/31703
USPC ....... 375/224, 233, 340, 346, 348, 350, 353; 327/52, 63, 65
See application file for complete search history.

(56) References Cited

U.S. PATENT DOCUMENTS

| | | | |
|---|---|---|---|
| 7,698,077 B2 * | 4/2010 | Brown | H03M 3/456 |
| | | | 702/57 |
| 8,497,739 B2 | 7/2013 | Koyama | |
| 8,867,595 B1 | 10/2014 | Luo et al. | |
| 8,964,917 B2 | 2/2015 | Chuang et al. | |
| 9,496,012 B2 | 11/2016 | Yildirim et al. | |
| 9,614,527 B2 | 4/2017 | Thachile | |
| 9,979,571 B2 | 5/2018 | Wang | |
| 10,277,441 B2 | 4/2019 | Hollis | |
| 10,848,296 B2 | 11/2020 | Toi | |
| 11,095,303 B1 | 8/2021 | Wagemans | |
| 2009/0185639 A1 * | 7/2009 | Han | H03M 1/1295 |
| | | | 327/307 |
| 2020/0274741 A1 | 8/2020 | Kang | |
| 2022/0182266 A1 * | 6/2022 | Xavier | H04L 25/0296 |
| 2023/0170887 A1 * | 6/2023 | Kim | H03K 5/05 |
| | | | 327/291 |

* cited by examiner

OFFSET DETECTOR CIRCUIT FOR DIFFERENTIAL SIGNAL GENERATOR, RECEIVER, AND METHOD OF COMPENSATING FOR OFFSET OF DIFFERENTIAL SIGNAL GENERATOR

CROSS-REFERENCE TO RELATED APPLICATION(S)

This application claims priority under 35 USC 119(a) to Korean Patent Application No. 10-2021-0167273 filed on Nov. 29, 2021 and Korean Patent Application No. 10-2022-0042073 filed on Apr. 5, 2022 in the Korean Intellectual Property Office, the disclosure of each of which is incorporated herein by reference in its entirety.

BACKGROUND

The present inventive concept relates to an offset detector circuit for a differential signal generator, a receiver including the differential signal generator, and a method of compensating for an offset of the differential signal generator.

Electronic devices include various functional blocks or devices configured to provide various functions. Various functional blocks or devices may transmit and receive data to and from each other through transmitters and receivers.

To transmit and receive data, a Pulse Amplitude Modulation (PAM)-N signaling method having N data modulation levels may be used. According to the PAM-N signaling method, signals having N voltage levels may be transmitted/received in one signal period (1UI).

On the other hand, some receivers may include a differential signal generator generating a differential signal based on a single-ended signal received through a transmission line. A differential signal generator may include elements mating with each other to generate a differential signal. In the case in which mismatch or asymmetric aging occurs between mating elements, a differential signal generator may have an offset, and an offset voltage may occur in the differential signal generated by the receiver. When an offset voltage occurs, an adverse effect may occur on the Ratio of Level separation Mismatch (RLM) or margin in the eye diagram of the differential signal. In detail, when receiving a signal having three or more voltage levels in one signal period according to the PAM-N signaling method, errors may occur frequently in data generated based on the signal.

A receiver receiving a single-ended PAM-N signal and generating a differential signal is useful to detect the offset voltage of the differential signal and to be able to compensate for the offset voltage.

SUMMARY

Example embodiments provide a receiver in which an offset of a differential signal generator may be detected based on a differential signal generated by the differential signal generator and the offset of the differential signal generator may be compensated for.

Example embodiments provide an offset detector circuit capable of detecting an offset of a differential signal generator.

Example embodiments provide an offset compensation method in which an offset of a differential signal generator may be compensated for.

According to example embodiments, an offset detector circuit for differential signals generator may include a digital signal register storing M unit digital signals received in latest M signal periods, where M is a natural number, among digital signals generated based on an externally received single-ended Pulse Amplitude Modulation (PAM)-N signal, where N is an odd number; a comparator outputting a comparison signal of a positive signal and a negative signal included in differential signals generated based on the single-ended PAM-N signal by the differential signal generator; a comparison result register storing M unit comparison signals corresponding to the latest M signal periods among the comparison signals; a pattern detector outputting a detection signal when the M unit digital signals match a predetermined signal pattern; and an offset checker checking patterns of the M unit comparison signals in response to the detection signal, and outputting an offset detection signal when the patterns of the M unit comparison signals match a predetermined offset pattern.

According to example embodiments, a receiver includes a differential signal generator receiving a single ended PAM-N signal, where N is an odd number, and generating differential signals based on the single-ended PAM-N signal, a reference signal, and a pair of compensation signals; an offset detector circuit detecting a predetermined signal pattern from a digital signal determined based on the single-ended PAM-N signal, and generating an offset detection signal when a comparison result signal of a positive signal and a negative signal included in the differential signals in signal periods corresponding to the predetermined signal pattern matches a predetermined offset pattern; and an offset compensator adjusting signal levels of the reference signal and the pair of compensation signals in response to the offset detection signal, and providing the reference signal and the pair of compensation signals having adjusted levels to the differential signal generator.

According to example embodiments, a method of compensating for an offset of a differential signal generator includes receiving a single-ended PAM-N signal, where N is an odd number; generating differential signals based on the single-ended PAM-N signal, a reference signal, and a pair of compensation signals; generating a comparison result signal of a positive signal and a negative signal included in the differential signals; generating a digital signal based on the single-ended PAM-N signal; detecting a predetermined signal pattern from the digital signal; adjusting a count value according to whether a comparison result signal corresponding to the detected signal pattern matches a predetermined offset pattern; and adjusting the reference signal or the pair of compensation signals based on the count value.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments will be described in detail with reference to the accompanying drawings.

Figure 1:
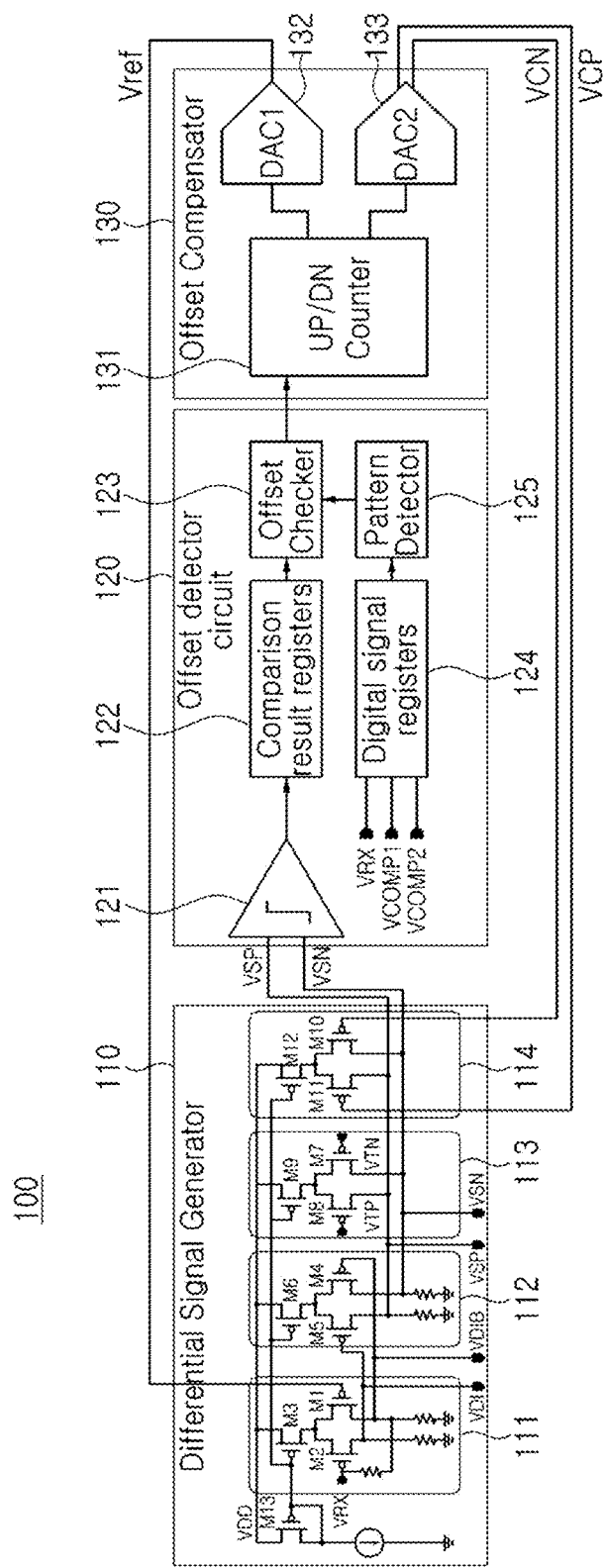
FIG. 1 is a diagram illustrating a receiver according to an example embodiment.

FIG. 1 is a diagram illustrating a receiver according to an example embodiment.

Referring to FIG. 1, a receiver 100 may include a differential signal generator 110, an offset detector circuit 120, and an offset compensator 130.

The differential signal generator 110 may receive a single-ended signal VRX from the outside of the receiver 100, and output differential signals VSP and VSN based on the received single-ended signal VRX. Herein, for convenience of description, terms of the differential signals and a differential signal may be used interchangeably.

The single-ended signal may include a real signal and a ground signal. The signal level of the single-ended signal may be determined as a value of a real signal measured with respect to the ground signal. When noise is generated in the real signal in a single-ended signal, it may be difficult to cancel the noise.

The differential signal may include two signals having the same amplitude and phases opposing each other. Hereinafter, two signals included in the differential signals VSP and VSN may be referred to as a positive signal VSP and a negative signal VSN. The negative signal VSN may be a complementary signal of the positive signal VSP.

The signal level of the differential signal may be determined by the difference between the two signals. On the other hand, when two signals are transmitted through adjacent signal lines, common mode noise may be included in the two signals. Even when common mode noise is included in the two signals, a difference between the two signals may be maintained. Since the signal level of the differential signal is determined by the difference between the two signals, the common mode noise may be canceled.

On the other hand, when an offset voltage is generated in the differential signal due to the offset of the differential signal generator 110 itself, the offset voltage is difficult to be easily removed even by the difference between the two signals. For example, the differential signal generator 110 may include a plurality of elements, and some elements of the plurality of elements may be paired with each other. Mismatches may occur due to minute differences in manufacturing processes between paired elements, or different levels of aging may occur when the elements are used. The differential signal generator 110 may have an offset due to mismatch or aging of paired elements.

When the differential signal generator 110 has an offset, an adverse effect may occur on Ratio of Level separation Mismatch (RLM) or margin in an eye diagram of the differential signal.

Referring to FIG. 1, the differential signal generator 110 may include a single ended to differential (S2D) converter 111, a differential amplifier 112, a decision feedback equalizer (DFE) 113, and a differential compensator 114.

The S2D converter 111 may output differential signals VDI and VDIB based on the externally received single-ended signal VRX. The S2D converter 111 may use a reference signal Vref to output the differential signals VDI and VDIB. For example, the S2D converter 111 may output a main signal VDI having a phase opposite to the single-ended signal VRX, and output an inverted signal VDIB obtained by inverting the phase of the main signal VDI with respect to the reference signal Vref. Herein, for convenience of description, the terms of the reference signal Vref and a reference voltage Vref may be used interchangeably.

The differential amplifier 112 may amplify a differential signal. To reduce the Inter-Symbol Interference (ISI) effect of the amplified differential signal, the DFE 113 may exclude the ISI effect expected from the previous data value of the differential signal from the current data. In this case, ISI refers to a phenomenon in which previously transmitted data affects currently transmitted data due to the limitation of the bandwidth of the data channel. The DFE 113 may change signal levels of the differential signal by signal levels of previous data signals VTP and VTN. Each of the previous data signals VTP and VTN may be a digital signal and may be provided from a certain circuit (not shown) included in the receiver 100 The differential compensator 114 may change signal levels of the differential signal by signal levels of the compensation signals VCP and VCN. The differential signals VDI and VDIB may pass through the differential amplifier 112, the DFE 113, and the differential compensator 114 to be output as final differential signals VSP and VSN. Herein, for convenience of description, the terms of the compensation signals VCP and VCN, compensation voltages VCP and VCN, and a pair of compensation signals VCP and VCN may be used interchangeably.

Referring to FIG. 1, the differential signal generator 110 may include a plurality of transistors M1-M13. Among the transistors, M1 and M2, M4 and M5, M7 and M8, and M10 and M11 may be paired with each other. An offset may occur in the differential signal generator 110 due to mismatch or aging of paired transistors, and an offset voltage may be generated between the differential signals VSP and VSN.

On the other hand, the single-ended signal VRX may be a signal according to a pulse amplitude modulation (PAM)-N signaling method having three or more voltage levels. As the number of voltage levels of the single-ended signal VRX increases, a large amount of data may be quickly received, but a margin between adjacent voltage levels may be narrowed. As the number of voltage levels of the single-ended signal VRX increases, the differential signal may be significantly adversely affected due to the offset of the differential signal generator 110.

According to an example embodiment of the present inventive concept, the differential signal generator 110 may generate the differential signals VSP and VSN based on the single-ended PAM-N (where N is an odd number) signal VRX. In addition, the offset detector circuit 120 may detect the offset of the differential signal generator 110 based on the single-ended PAM-N signal VRX and signal patterns of the differential signals VSP and VSN. The offset compensator 130 may compensate the offset of the differential signal generator 110 by adjusting a level of the reference voltage Vref or levels of the compensation voltages VCP and VCN based on the detected offset. Herein, for convenience of description, the terms of the level(s), the voltage level(s), and the signal level(s) may be used interchangeably.

The offset detector circuit 120 may include a comparator 121, a comparison result register 122, an offset checker 123, a digital signal register 124, and a pattern detector 125.

The digital signal register 124 may generate a digital signal corresponding to the signal level of the single-ended PAM-N signal VRX, and store M number of unit digital signals corresponding to latest M (where M is a natural number) signal periods among the generated digital signals. For example, the digital signal register 124 may include M registers each storing one unit digital signal.

The comparator 121 may compare potentials of the positive signal VSP and the negative signal VSN, and may output a comparison signal. For example, the comparator 121 may output a comparison signal having a high level when the positive signal VSP has a higher potential than the negative signal VSN, and output a comparison signal having a low level when the positive signal VSP has a lower potential than the negative signal VSN.

The comparison result register 122 may store M unit comparison signals corresponding to latest M signal periods among the comparison signals. For example, the comparison result register 122 may include M registers each storing one unit comparison signal.

The pattern detector 125 may obtain the M unit digital signals from the digital signal register 124 every signal period, and determine whether the acquired unit digital signals correspond to a predetermined signal pattern. In addition, the pattern detector 125 may output a detection signal to the offset checker 123 when the unit digital signals match a predetermined signal pattern.

The offset checker 123 may obtain M unit comparison signals from the comparison result register 122 in response to the detection signal. The M unit comparison signals stored in the comparison result register 122 may be signals generated in the same signal period as when the unit digital signals match a predetermined signal pattern. For example, the unit comparison signals may be comparison results of the positive signal VSP and the negative signal VSN when the single-ended PAM-N signal VRX has a predetermined signal pattern.

The offset checker 123 may determine whether the M unit comparison signals obtained from the comparison result register 122 match a predetermined offset pattern. For example, the DC levels of the positive signal VSP and the negative signal VSN may be different when the differential signal generator 110 has an offset and when the differential signal generator 110 does not have an offset. Even when differential signals VSP and VSN are generated based on the same single-ended PAM-N signal VRX, a pattern of a signal as a result of comparing the positive signal VSP and the negative signal VSN may be different depending on whether the differential signal generator 110 has an offset.

The offset checker 123 may determine in advance a comparison result signal pattern that may occur when the differential signal generator 110 has an offset as an offset pattern. In addition, the offset checker 123 may determine whether the differential signal generator 110 has an offset by determining whether the obtained unit comparison signals match the predetermined offset pattern. The offset checker 123 may output an offset detection signal to the offset compensator 130 when the obtained unit comparison signals match the predetermined offset pattern.

The offset compensator 130 may include an up/down counter 131, a first Digital-to-Analog Converter (DAC) 132, and a second DAC 133.

The up/down counter 131 may have a count value for determining the reference signal Vref and the compensation signals VCP and VCN. The up-down counter 131 may adjust signal levels of the reference signal Vref and the pair of compensation signals VCP and VCN by increasing or decreasing the count value based on the offset detection signal output from the offset detector circuit 120.

For example, the offset detection signal may be any one of a positive offset detection signal and a negative offset detection signal. The positive offset detection signal may indicate a state in which the DC level of the positive signal VSP is greater than the DC level of the negative signal VSN due to the offset of the differential signal generator 110, and the negative offset detection signal may indicate a state in which the DC level of the negative signal VSN is greater than the DC level of the positive signal VSP. The up-down counter 131 may increase the count value in response to the positive offset detection signal and decrease the count value in response to the negative offset detection signal.

Depending on the implementation, the count value may have K (K is a natural number) bit value, and among the K-bit values, the upper L (L is a natural number) bit value may be used to determine the signal level of the reference signal Vref, and the lower (K-L) bit value may be used to determine the signal level of the compensation signals VCP and VCN. For example, L may be (K/2).

The first and second DACs 132 and 133 may receive the count value corresponding to a digital signal, and output a reference signal Vref and compensation signals VCP and VCN corresponding to an analog signal. According to implementation, the first DAC 132 may receive the upper L-bit value among the count values and output the reference signal Vref. In addition, the second DAC 133 may receive the lower (K-L) bit value of the count value and output the compensation signals VCP and VCN.

The level of the reference signal Vref may increase by a first unit level whenever the L-bit value increases by '1'. In addition, the level of the positive compensation signal VCP may decrease by a second unit level whenever the (K-L) bit value increases by '1', and the level of the negative compensation signal VCN may increase by the second unit level whenever the (K-L) bit value increases by '1'.

The reference signal Vref may significantly adjust the levels of the differential signals VSP and VSN, and the compensation signals VCP and VCN may fine-tune the levels of the differential signals VSP and VSN. For example, the first unit level may have a greater value than the second unit level. However, to fine-tune the levels of the differential signals VSP and VSN in all voltage ranges, the first unit level may have a value smaller than $2^{(K-L)}$ times the second unit level.

The reference signal Vref and the compensation signals VCP and VCN may be fed back to the differential signal generator 110, and the differential signal generator 110 may output the differential signals VSP and VSN in which the magnitude of the offset voltage has been reduced. For example, the offset of the differential signal generator 110 may be compensated.

Hereinafter, an offset compensation process of a differential signal generator according to an example embodiment will be described in detail with reference to FIGS. 2A to 2D, 3, 4, 5A, 5B, 6A to 6D, 7 to 9, and 10A to 10C.

FIGS. 2A to 2D are diagrams illustrating an offset compensation method of a differential signal generator according to adjustment of a reference signal Vref and compensation signals VCP and VCN. An offset compensation method is described by taking the case in which the single-ended signal VRX has a waveform swinging between two signal levels as an example in FIGS. 2A to 2D.

Figure 2A:
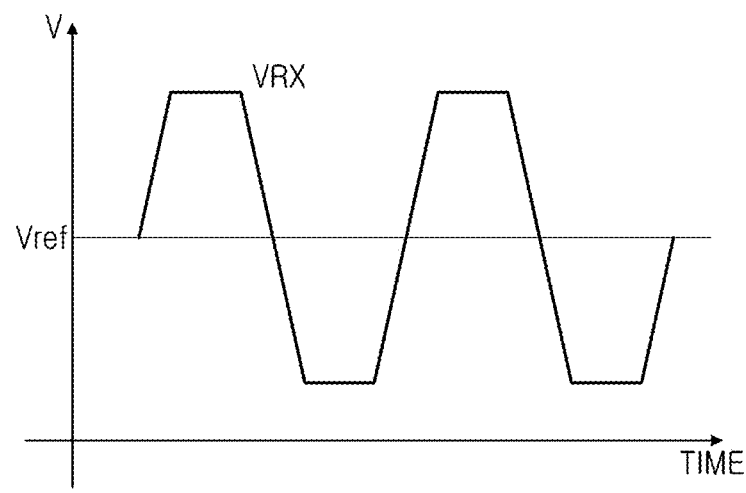
FIGS. 2A to 2D are diagrams illustrating an offset compensation method of a differential signal generator.
Figure 2B:
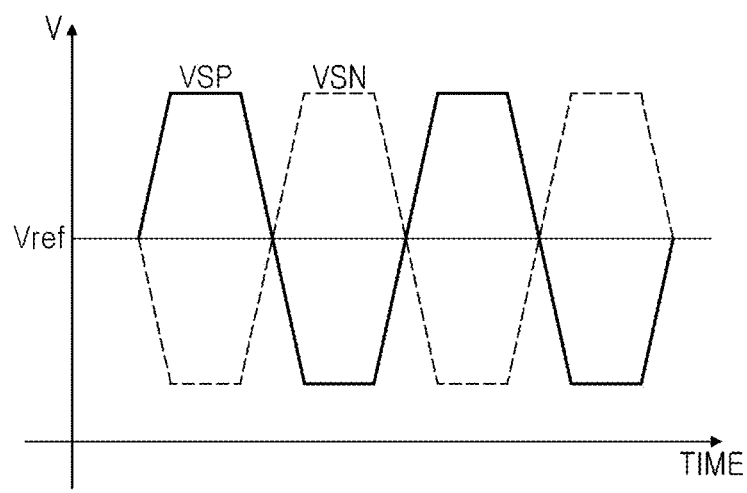

FIG. 2A is a graph illustrating signal level over time of a single ended signal VRX swinging between two signal levels. FIG. 2B is a graph illustrating signal levels of ideal differential signals VSP and VSN over time.

The differential signals VSP and VSN may include a positive signal VSP having the same phase as the single-ended signal VRX, and a negative signal VSN of which a phase is inverted based on the reference signal Vref.

In an ideal case, the DC levels of the positive signal VSP and the negative signal VSN may be equal to each other. The same DC levels of the positive signal VSP and the negative signal VSN may indicate that the differential signals VSP and VSN do not have offset voltages.

Figure 2C:
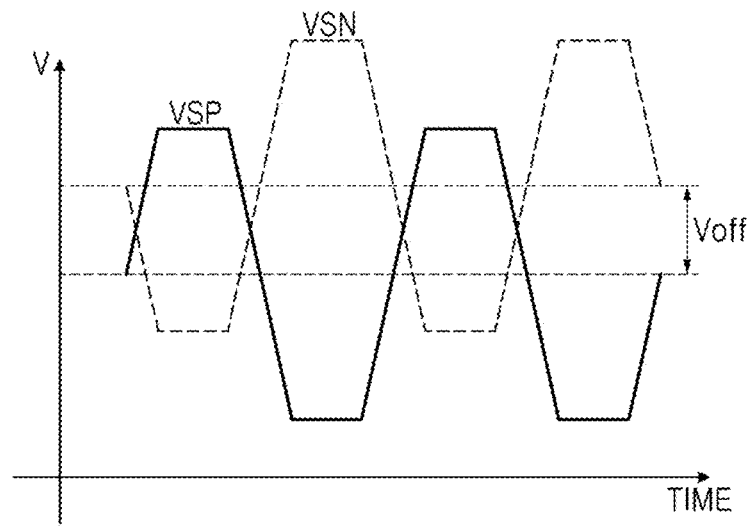

FIG. 2C is a graph illustrating signal levels of differential signals VSP and VSN having an offset voltage over time. When the differential signal generator 110 has an offset, the differential signals VSP and VSN generated by the differential signal generator 110 may have an offset voltage.

The fact that the differential signals VSP and VSN have offset voltages may indicate that the DC levels of the positive signal VSP and the negative signal VSN are different from each other. Referring to FIG. 2C, a magnitude Voff of an offset voltage that is a difference between DC levels of a positive signal VSP and a negative signal VSN is illustrated.

On the other hand, in the example of FIG. 2C, the DC level of the positive signal VSP may be lower than the DC level of the negative signal VSN. For example, the differential signals VSP and VSN may have negative offset voltages.

Figure 2D:
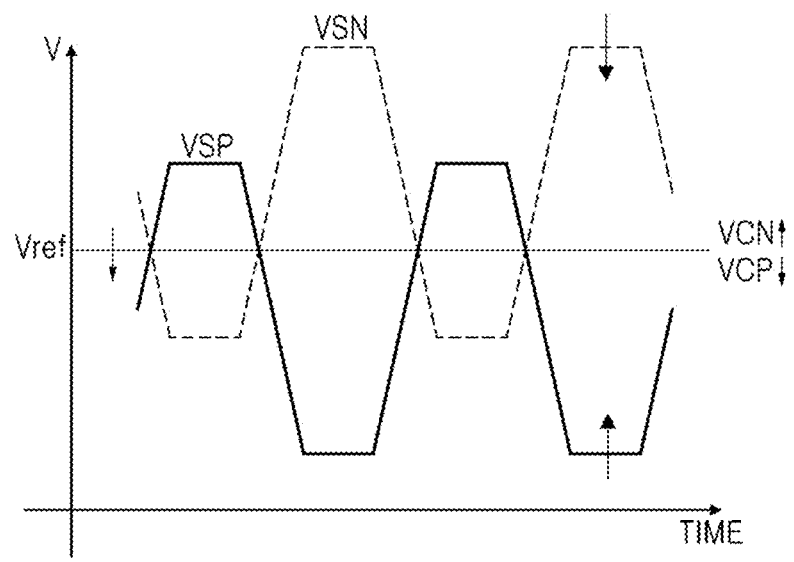

FIG. 2D is a graph illustrating levels of a reference voltage Vref and compensation voltages VCP and VCN for compensating an offset of a differential signal generator. When the differential signals VSP and VSN have negative offset voltages as described in FIG. 2C, by lowering the level of the reference voltage Vref, the magnitude of the offset voltage between the differential signals VSP and VSN may be reduced. Alternatively, by decreasing the level of the positive compensation signal VCP and increasing the level of the negative compensation signal VCN, the magnitude of the offset voltage between the differential signals VSP and VSN may be reduced.

Contrary to FIG. 2D, when the differential signals VSP and VSN have a positive offset voltage, by increasing the level of the reference voltage Vref or by increasing the level of the positive compensation signal VCP and decreasing the level of the negative compensation signal VCN, the magnitude of the offset voltage between the differential signals VSP and VSN may be reduced.

Figure 3:
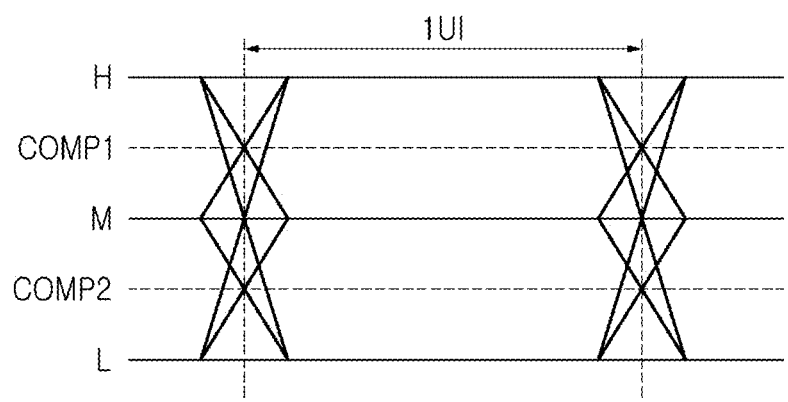
FIG. 3 is a diagram illustrating a pulse amplitude modulation (PAM)-3 signaling method.

FIG. 3 is a diagram illustrating a PAM-3 signaling method as an example of a PAM-N (N is an odd number) signaling method.

Referring to FIG. 3, the PAM-3 signal may have three levels H, M and L. The receiver 100 may receive a unit signal having any one of three levels H, M and L in one signal period or one unit interval (1UI).

The receiver 100 may compare the potential of the unit signal with the comparison levels COMP1 and COMP2. Each of the comparison levels COMP1 and COMP2 may be an intermediate value of two adjacent levels among the levels H, M, and L that the PAM-3 signal may have. For example, when the potential of the unit signal is higher than the comparison level COMP1, the receiver 100 may determine that the unit signal corresponds to the high level H. In addition, when the potential of the unit signal is lower than the comparison level COMP1 and higher than the comparison level COMP2, the receiver 100 may determine that the unit signal corresponds to the medium level M, and when the potential of the unit signal is lower than the comparison level COMP2, the receiver 100 may determine that the unit signal corresponds to the low level L.

According to the PAM-3 signaling method, 1.5 bits ($\log 2 3 \approx 1.56$) may be theoretically transmitted in one signal period. Depending on the implementation, the PAM-3 signal may be encoded to transmit a 3-bit signal in two signal periods, but the encoding and decoding method of the PAM-3 signal in an example embodiment of the present inventive concept is not limited.

On the other hand, the differential signal generator 110 described with reference to FIG. 1 may generate the differential signals VSP and VSN based on the single-ended PAM-3 signal VRX. By the DFE 113, the waveform of the differential signals VSP and VSN may be slightly deformed from the waveform of the single-ended PAM-3 signal VRX.

When the differential PAM-3 signals VSP and VSN has a medium level M, the ideal differential signals VSP and VSN may have a potential close to the DC level. For example, when the differential signal generator 110 has no offset, a comparison result of the positive signal VSP and the negative signal VSN having a medium level may be a Don't care. When the differential signal generator 110 does not have an offset, the values of the positive signal VSP and the negative signal VSN may be similar to each other, and this is because the comparator may have hysteresis when the values of the positive signal VSP and the negative signal VSN are similar to each other.

However, because the waveforms of the differential signals VSP and VSN are deformed by the DFE 113, even when the differential signal generator 110 does not have an offset, a difference may occur between the values of the positive signal VSP and the negative signal VSN having the medium level. In this case, the comparison result of the positive signal VSP and the negative signal VSN may have a specific level.

According to an example embodiment, the offset detector circuit 120 may determine whether the differential signal generator 110 has an offset. In a specific signal pattern in which a difference occurs in the values of a positive signal VSP and a negative signal VSN having a medium level, whether the differential signal generator 110 has an offset may be determined depending on whether the values of the positive signal VSP and the negative signal VSN having the medium level have the specific level. Hereinafter, an offset detection method according to an example embodiment will be described in detail with reference to FIGS. 4, 5A, 5B, 6A to 6D, and 7.

Figure 4:
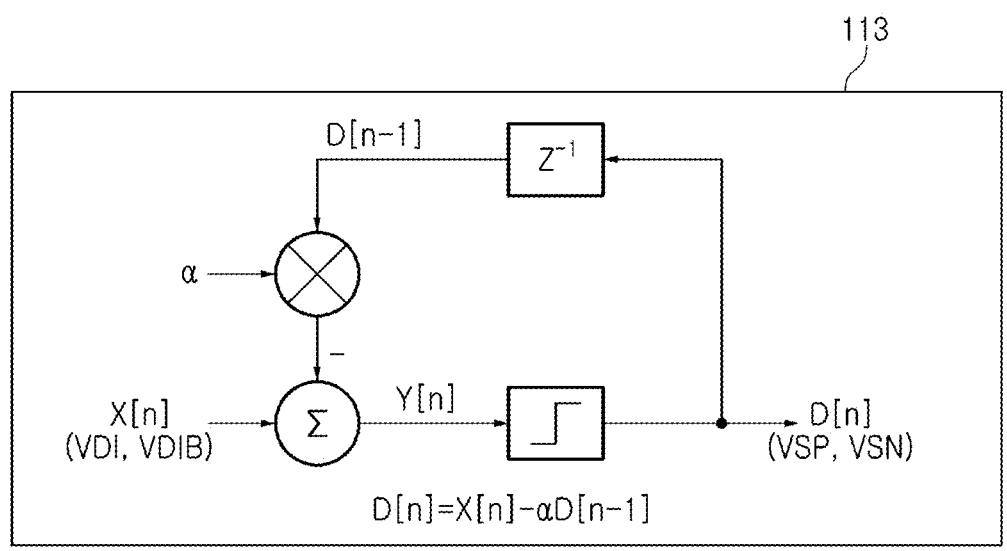
FIG. 4 is a diagram illustrating a decision feedback equalizer (DFE) in detail.

FIG. 4 is a view illustrating in detail the DFE 113 described with reference to FIG. 1.

Referring to FIG. 4, the DFE 113 may have a structure in which the original transmission data D[n] value may be obtained by excluding the value multiplied by the appropriate coefficient α in consideration of the impact of ISI expected from the value of the previous data D[n−1], from the current data X[n].

On the other hand, FIG. 4 exemplifies a 1-tap DFE in which the value of the original transmission data D[n] is calculated in consideration of only the influence of the immediately preceding data D[n−1], but the present inventive concept is not limited thereto. For example, DFE 113 may further consider the impact of ISI expected by not only the n−1th data, but also the n−2th data, n−3th data, . . . , to determine the transmitted data in the nth signal period. When the DFE 113 determines the current transmission data D[n] using several previous pieces of data, older data may be designed to have less impact on the current transmitted data.

As described with reference to FIG. 1, the differential signals VSP and VSN may be signals corrected by the DFE 113. For example, DFE 113 may determine the differential signals VSP and VSN of the current signal period by excluding the value obtained by multiplying the value of the differential signals VSP and VSN in the immediately previous signal period by the coefficient α, from the differential signals VDI and VDIB generated based on the single level of the signal VRX of the current signal period.

Figure 5A:
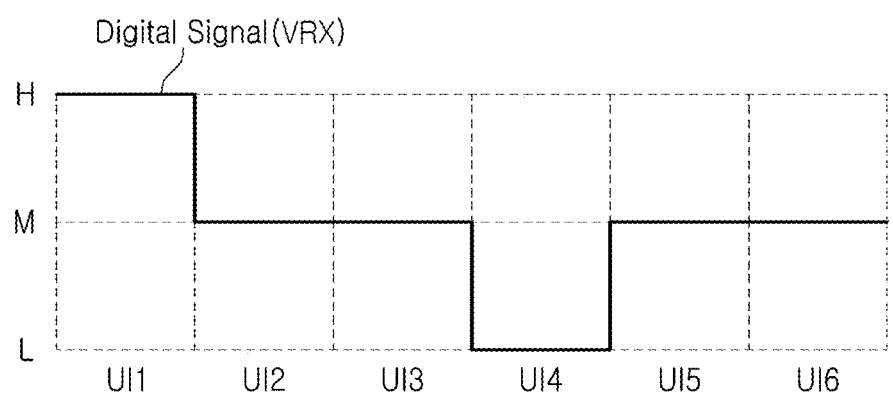
FIGS. 5A and 5B are timing diagrams illustrating a digital signal corresponding to a PAM-3 signal and a positive signal corresponding to the digital signal.
Figure 5B:
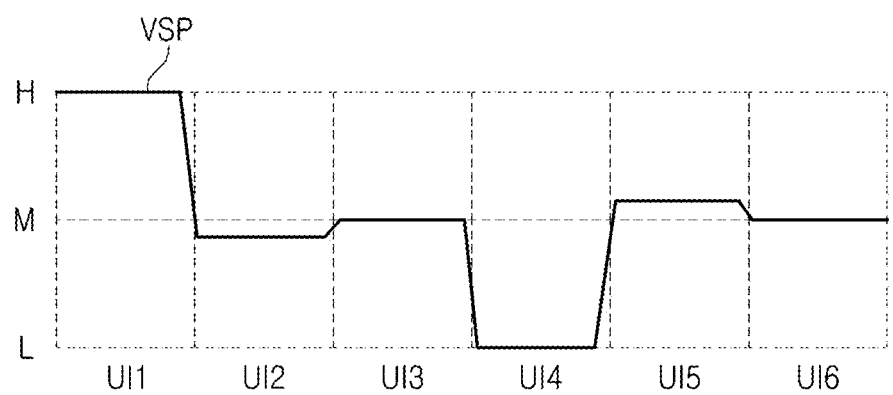

FIGS. 5A and 5B are diagrams for comparing a digital signal corresponding to the PAM-3 signal and a positive signal VSP corresponding to the digital signal.

FIG. 5A illustrates the signal level over time of a digital signal corresponding to the PAM-3 signal. The digital signal may correspond to the level of the single-ended PAM-3 signal VRX received by the receiver 100. A digital signal may have a plurality of levels high level (H), medium level (M), and low level (L), and may be generated based on the comparison result of the potential of the single-ended PAM-3 signal VRX and the comparison levels COMP1 and COMP2.

FIG. 5A illustrates a digital signal in six signal periods UI1-UI6. In each of the signal periods UI1-UI6, the digital signal may have any one of a plurality of levels H, M, and L. For example, in the six signal periods UI1-UI6, the digital signal may have a signal pattern of high level-medium level-medium level-low level-medium level-medium level (H-M-M-L-M-M).

FIG. 5B illustrates the signal level of the positive signal VSP in the six signal periods UI1-UI6. The positive signal VSP may have the same phase as the single-ended PAM-3 signal VRX. Accordingly, the positive signal VSP may have a waveform similar to that of the digital signal of FIG. 5A.

However, when the digital signal has a signal pattern of H-M-M-L-M-M in six signal periods UI1 to UI6, the potential of the positive signal VSP in the second signal period UI2 and the fifth signal period UI5 may be corrected by the DFE 113.

For example, to generate the positive signal VSP of the second signal period UI2, the DFE 113 may exclude the influence that the digital signal in the first signal period UI1 may have, from the main signal VDI generated based on the single-level PAM-3 signal VRX of the second signal period UI2. Since the digital signal of the first signal period UI1 has a high level H, the positive signal VSP of the second signal period UI2 may have a slightly reduced value compared to the main signal VDI of the second signal period UI2. Referring to FIG. 5B, the positive signal VSP of the second signal period UI2 may have a potential slightly lower than the ideal medium level M.

Similarly, the positive signal VSP of the fifth signal period UI5 may have a potential slightly higher than the ideal medium level M. The DFE 113 may exclude an effect that the digital signal of the fourth signal period UI4 may have, from the main signal VDI of the fifth signal period UI5. Since the digital signal of the fourth signal period UI4 has a low level L, the positive signal VSP of the fifth signal period UI5 may have a slightly increased value compared to the main signal VDI of the fifth signal period UI5.

On the other hand, in the third, fourth, and sixth signal periods UI3, UI4 and UI6, since the digital signal of the immediately preceding signal period has a medium level M, the positive signal VSP may hardly be deformed.

Hereinafter, a method capable of detecting the offset of the differential signal generator 110 when the PAM-3 signal has a specific signal pattern will be described with reference to FIGS. 6A to 6D.

Figure 6A:
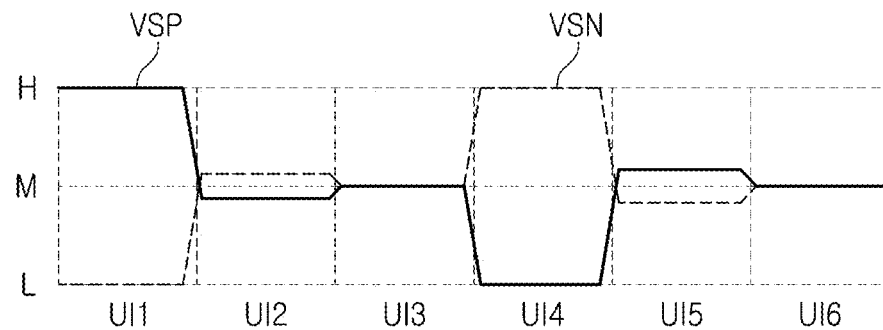
FIGS. 6A to 6D are diagrams illustrating, in detail, a method of detecting an offset of a differential signal generator according to an example embodiment.

FIG. 6A illustrates a comparison result of a positive signal VSP and a negative signal VSN according to a pattern of a digital signal when the differential signal generator 110 does not have an offset.

Referring to FIG. 6A, the digital signal may have a pattern of H-M-M-L-M-M as in FIG. 5A. When the digital signal has a pattern of H-M-M-L-M-M, the potential of the positive signal VSP in the second and fifth signal periods UI2 and UI5 may be corrected as described with reference to FIG. 5B. For example, when the differential signal generator 110 has no offset, the negative signal VSN may have an inverted waveform from that of the positive signal VSP based on the ideal medium level M.

In FIG. 6A, the level of a signal as a result of comparison between the positive signal VSP and the negative signal VSN in six signal periods UI1-UI6 is illustrated. In the third and sixth signal periods UI3 and UI6, since there is little potential difference between the positive signal VSP and the negative signal VSN, the signal level as the comparison result may be Don't care H/L. On the other hand, in the second and fifth signal periods UI2 and UI5, a difference may occur in the potentials of the positive signal VSP and the negative signal VSN due to the operation of the DFE 113 described with reference to FIG. 5B. Therefore, as a result of the comparison, the signal level may be clearly determined as a low level L or a high level H.

For example, when the differential signal generator 110 does not have an offset, for example, when the digital signal has a pattern of H-M-M, the comparison result signal may have a pattern of H-L-H or H-L-L, and for example, when the digital signal has a pattern of L-M-M, the comparison result signal may have a pattern of L-H-H or L-H-L.

Figure 6B:
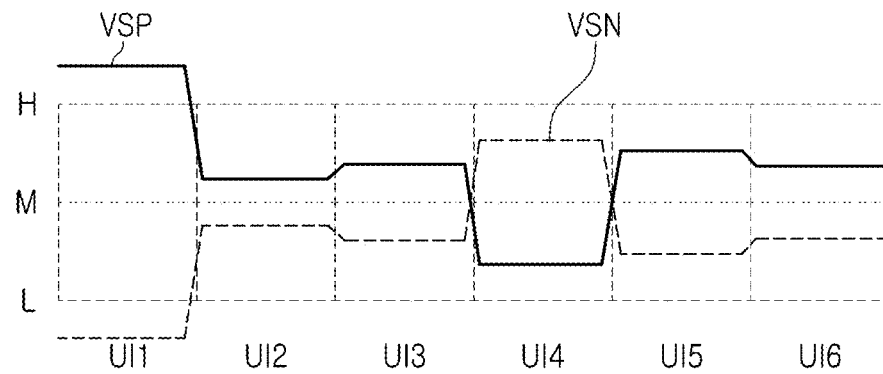

FIG. 6B illustrates a comparison result of a positive signal VSP and a negative signal VSN according to a digital signal pattern when the differential signal generator 110 has a positive offset.

Referring to FIG. 6B, when the differential signal generator 110 has a positive offset, the medium level M of the positive signal VSP may be higher than the medium level M of the negative signal VSN. In detail, in the second signal period UI2, differently from the case in which the differential signal generator 110 does not have an offset, a signal as a result of comparison between the positive signal VSP and the negative signal VSN may have a high level H. For example, in a signal period in which a digital signal has a signal pattern falling from a high level H to a medium level M, when the comparison result signal is maintained at the high level H, it may be determined that the differential signal generator 110 has a positive offset.

According to an example embodiment, when the offset detector circuit 120 detects that the digital signal generated based on the single-ended PAM-3 signal VRX has a pattern of H-M-M, it may be checked whether the signal as a result of comparison between the positive signal VSP and the negative signal VSN has a pattern of H-H-H. For example, when the comparison result signal has a pattern of H-H-H, the offset detector circuit 120 may determine that the differential signal generator 110 has a positive offset, and output the offset detection signal.

Figure 6C:
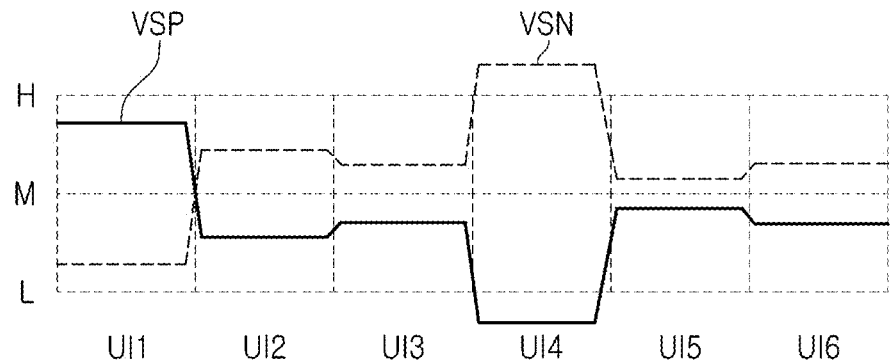

FIG. 6C illustrates a comparison result of a positive signal VSP and a negative signal VSN according to a digital signal pattern when the differential signal generator 110 has a negative offset.

Referring to FIG. 6C, the medium level M of the positive signal VSP may be lower than the medium level M of the negative signal VSN. In detail, in the fifth signal period UI5, the comparison result signal of the positive signal VSP and the negative signal VSN may have a low level L, unlike the case in which the differential signal generator 110 does not have an offset. For example, in the signal period in which the digital signal has a signal pattern rising from the low level L to the medium level M, when the comparison result signal is maintained at the low level L, it may be determined that the differential signal generator 110 has a negative offset.

According to an example embodiment, when the offset detector circuit 120 detects that the digital signal generated based on the single-ended PAM-3 signal VRX has a pattern of L-M-M, it may be checked whether a signal as a result of comparison between the positive signal VSP and the negative signal VSN has an L-L-L pattern. For example, when the comparison result signal has a pattern of L-L-L, the offset detector circuit 120 may determine that the differential signal generator 110 has a negative offset, and output an offset detection signal. Hereinafter, among the comparison result patterns, a pattern indicating that the differential signal generator 110 has an offset, such as the H-H-H pattern and the L-L-L pattern described in FIGS. 6B and 6C, may also be referred to as an offset pattern.

On the other hand, there is a case in which the offset pattern is detected even though the differential signal generator 110 does not have an offset. For example, in a case in which the influence of ISI is not normally excluded from the differential signals VSP and VSN, the waveforms of the differential signals VSP and VSN may be distorted, an offset pattern may be detected based on the distorted differential signals VSP and VSN.

Figure 6D:
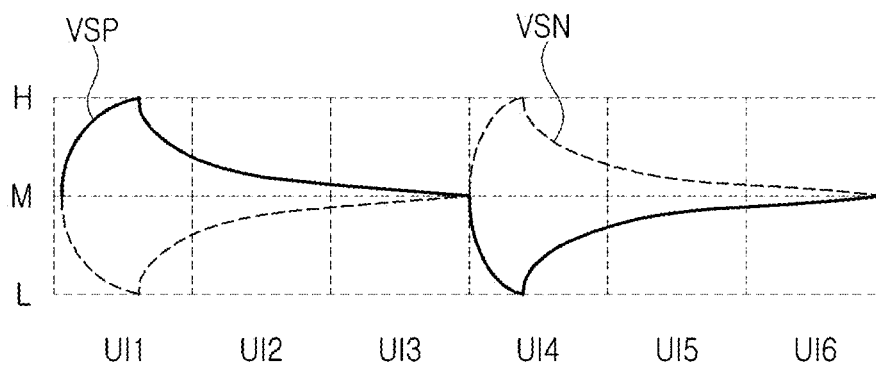

FIG. 6D illustrates the comparison result of the distorted positive signal VSP and the negative signal VSN.

Referring to FIG. 6D, the digital signal may have a pattern of H-M-M-L-M-M. In the example of FIG. 6D, the positive signal VSP may have a high level H in the first signal period UI1. In the second and third signal periods UI2 and UI3, due to the ISI caused by the positive signal VSP of the first signal period UI1, the potential of the positive signal VSP may be significantly higher than the medium level M. Similarly, the potential of the negative signal VSN in the second and third signal periods UI2 and UI3 may be significantly lower than the medium level M. In the first to third signal periods UI1-UI3, a comparison result corresponding to the digital signal H-M-M may have an H-H-H pattern. Similarly, in the fourth to sixth signal periods UI4-U16, a comparison result corresponding to the digital signal L-M-M may have an L-L-L pattern.

According to an example embodiment, the offset detector circuit 120 may output a positive offset detection signal when the digital signal H-M-M is detected and the offset pattern H-H-H is confirmed, and may output a negative offset detection signal when the digital signal L-M-M is detected and the offset pattern L-L-L is confirmed.

According to an example embodiment, the differential signal generator 110 generates a differential signal, the offset detector circuit 120 generates an offset detection signal of the differential signal generator 110, and the offset compensator 130 provides the reference voltage Vref and the compensation voltages VCP and VCN to the differential signal generator 110, based on the offset detection signal, and these operations may be performed repeatedly. For example, the reference signal Vref and the compensation signals VCP and VCN may be adjusted according to a result of repeating the offset detection in the receiver 100 several times. In the case in which the offset detection signal is output due to distortion of the signal even though there is no offset in the differential signal generator 110, the positive offset detection signal and the negative offset detection signal may be output at a similar ratio. Therefore, even when the offset detection signal is output due to signal distortion, the reference voltage Vref and the compensation voltages VCP and VCN may be maintained at similar levels.

Figure 7:
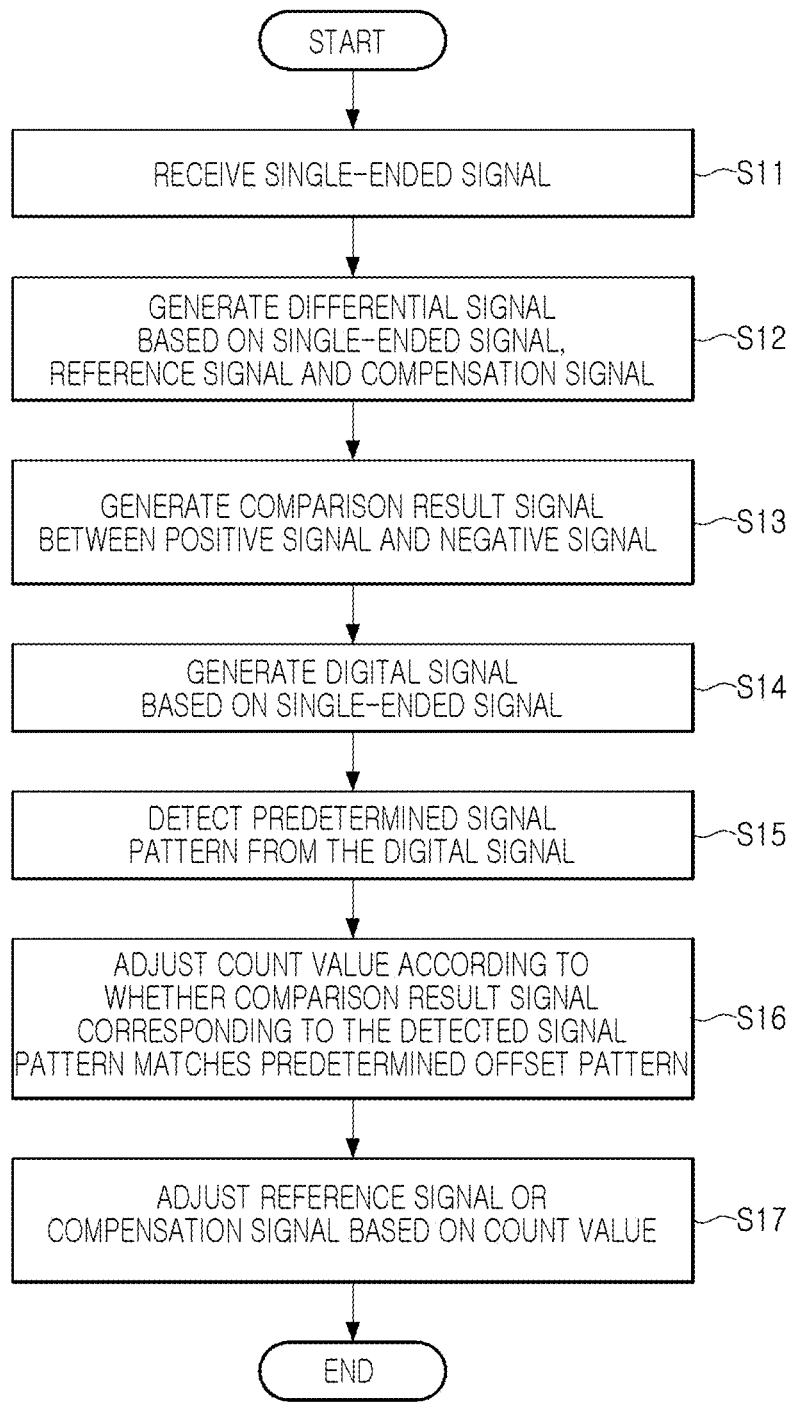
FIG. 7 is a flowchart illustrating a method of compensating for an offset of a differential signal generator according to an example embodiment.

FIG. 7 is a flowchart illustrating a method of compensating for an offset of a differential signal generator according to an example embodiment.

In operation S11, the receiver 100 may receive a single-ended PAM-3 signal.

In operation S12, the differential signal generator 110 may generate the differential signals VSP and VSN based on the single-ended PAM-3 signal, the reference signal Vref, and the compensation signals VCP and VCN. As described with reference to FIGS. 1, 4 and 5B, when the PAM-3 signal changes from high level H to medium level M or from low level L to medium level M, the potential of the differential signals VSP and VSN may be different from the ideal medium level M by the operation of the DFE 113.

In operation S13, the offset detector circuit 120 may generate a comparison result signal between the positive signal VSP and the negative signal VSN received from the differential signal generator 110. When the PAM-3 signal changes from high level H to medium level M or from low level L to medium level M, the comparison result signal at the medium level M may be clearly determined as either a high level H or a low level L.

In operation S14, the offset detector circuit 120 may generate a digital signal based on the single-ended PAM-3 signal VRX. As described with reference to FIG. 5A and the like, the offset detector circuit 120 may compare the potential of the single-ended PAM-3 signal VRX and the comparison levels COMP1 and COMP2, and determine the level of the single-ended PAM-3 signal in each signal period from among a plurality of levels H, M and L.

In operation S15, the offset detector circuit 120 may detect a predetermined signal pattern from the digital signal. As described with reference to FIGS. 6B and 6C, the predetermined signal pattern may be an H-M-M pattern or an L-M-M pattern.

As described with reference to FIG. 1, the digital signal register 124 included in the offset detector circuit 120 may store the levels of unit digital signals in latest M signal periods. For example, the digital signal register 124 may store the levels of unit digital signals in the last three signal periods. The pattern detector 125 may continuously monitor the levels of the digital signals stored in the digital signal register 124, and detect a state in which the level of the unit digital signals is H-M-M or L-M-M.

According to an example embodiment, even when the receiver 100 receives a signal having an arbitrary pattern, offset detection and offset compensation may be performed by detecting a predetermined signal pattern from the received signal. Accordingly, the receiver 100 may perform offset detection and offset compensation using an arbitrary signal without separately receiving a test signal having a predetermined signal pattern.

In operation S16, the offset compensator 130 may adjust the count value according to whether the comparison result signal corresponding to the detected signal pattern matches a predetermined offset pattern.

As a first example, when the H-M-M signal pattern is detected and the pattern stored in the comparison result register 122 is H-H-H, the offset detector circuit 120 may output a positive offset detection signal because the comparison result signal matches the predetermined offset pattern. The offset compensator 130 may increase the count value in response to the positive offset detection signal.

As a second example, when the L-M-M signal pattern is detected and the pattern stored in the comparison result register 122 is L-L-L, the offset detector circuit 120 may output a negative offset detection signal because the comparison result signal matches the predetermined offset pattern. The offset compensator 130 may adjust the count value to decrease in response to the negative offset detection signal.

As a third example, when the H-M-M signal pattern is detected and the pattern stored in the comparison result register 122 is H-L-H, since the comparison result signal does not match the predetermined offset pattern, the offset detector circuit 120 may not output the offset detection signal. Accordingly, the offset compensator 130 may maintain the count value.

In operation S17, the offset compensator 130 may adjust the reference signal Vref or the compensation signals VCP and VCN based on the count value. As described with reference to FIG. 1, when the value of the lower bits of the count value is changed, by finely adjusting the compensation signals VCP and VCN, the DC level of the differential signals VSP and VSN may be finely adjusted. When the values of the upper bits of the count value are changed, by significantly adjusting the reference signal Vref, the DC level of the differential signals VSP and VSN may be significantly adjusted.

The reference signal Vref and the compensation signals VCP and VCN adjusted by the offset compensator 130 may be fed back to the differential signal generator 110. The offset levels of the differential signals VSP and VSN generated based on the adjusted reference signal Vref and compensation signals VCP and VCN may be relaxed, and as a result, the offset of the differential signal generator 110 may be compensated.

Figure 8:
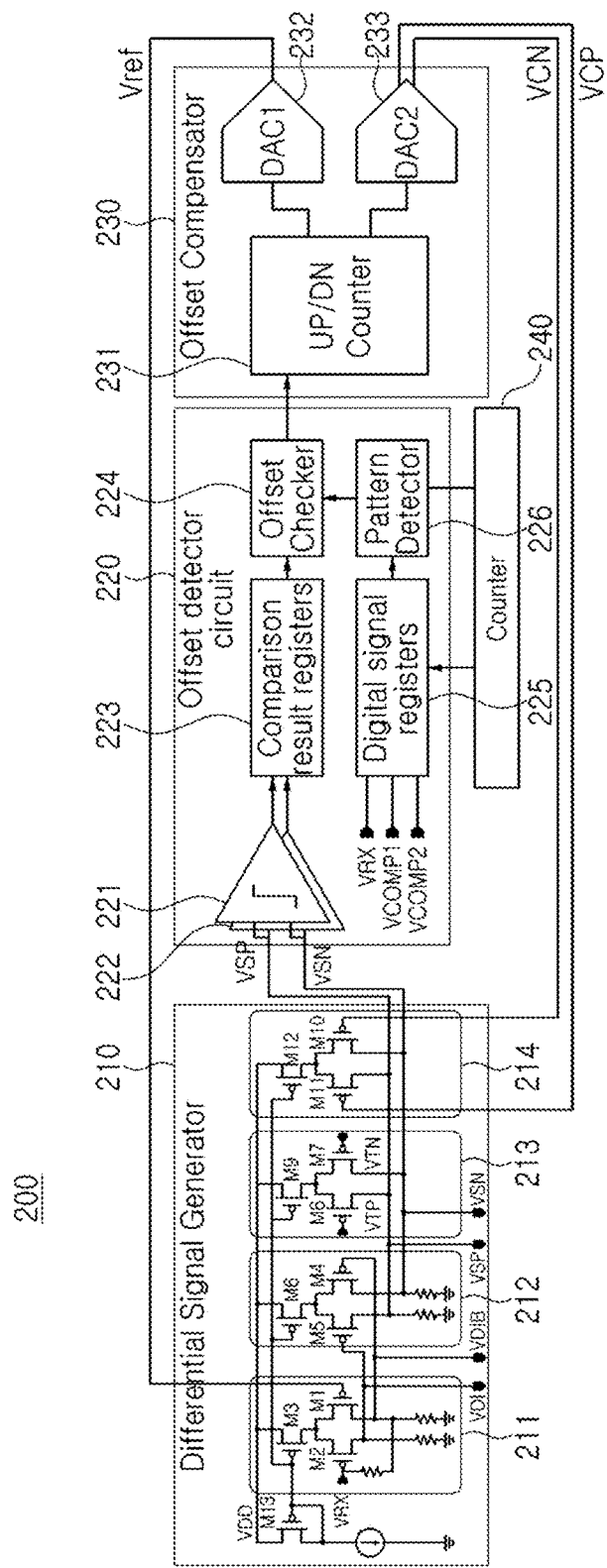
FIG. 8 is a diagram illustrating a receiver according to an example embodiment.

FIG. 8 is a diagram illustrating a receiver according to an example embodiment.

Referring to FIG. 8, a receiver 200 may include a differential signal generator 210, an offset detector circuit 220, an offset compensator 230, and a counter 240. The differential signal generator 210, the offset detector circuit 220 and the offset compensator 230 of FIG. 8 may have a structure similar to that of the differential signal generator 110, the offset detector circuit 120 and the offset compensator 130 described with reference to FIG. 1. Hereinafter, an example embodiment of the present inventive concept will be described focusing on the differences between the receiver 200 of FIG. 8 and the receiver 100 of FIG. 1.

According to an example embodiment, the offset detector circuit 220 may include a plurality of comparators for comparing the positive signal VSP and the negative signal VSN, and the plurality of comparators may include a first comparator 221 and a second comparator 222. The first and second comparators 221 and 222 may receive the differential signals VSP and VSN, and may alternately generate comparison results in every signal period. The offset detector circuit 220 may generate a comparison result more quickly by using the first and second comparators 221 and 222.

According to an example embodiment, the counter 240 updates the count value whenever the offset detector circuit 220 detects a predetermined signal pattern, thereby counting the number of times the offset check operation has been performed, and may control the offset detector circuit such that the offset check operation is performed a predetermined number of times. An optimal level of the reference signal Vref and the compensation signals VCP and VCN may be set based on offset check operations of multiple times, and the offset of the differential signal generator 210 may be effectively compensated.

On the other hand, in FIGS. 3, 4, 5A, 5B, 6A to 6D, 7, and 8, the example embodiment has been described taking the case in which the receiver receives the PAM-3 signal as an example. However, the present inventive concept is not limited thereto, and the present inventive concept may be applied to a case in which the receiver receives a PAM-N (N is an odd number) signal.

Hereinafter, an example embodiment of a case in which a receiver receives a PAM-5 signal will be described with reference to FIGS. 9 and 10A to 10C.

Figure 9:
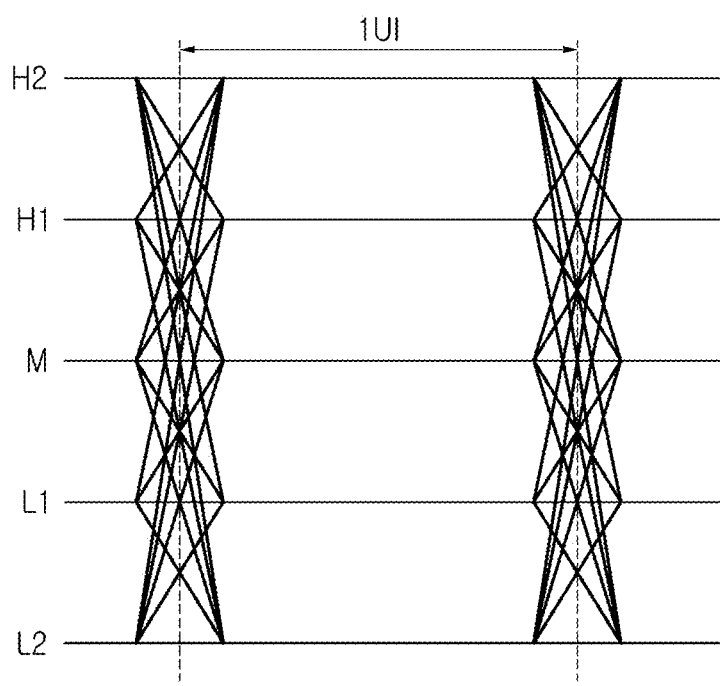
FIG. 9 is a diagram illustrating a PAM-5 signal.

FIG. 9 is a diagram illustrating a PAM-5 signal.

Referring to FIG. 9, the PAM-5 signal may have five levels H2, H1, M, L1, and L2. The receiver may receive a unit signal having any one of five levels in one signal period (1UI). The receiver may determine the level of the unit signal by comparing the unit signal with four comparison levels. Each of the four comparison levels may be an intermediate value of two adjacent levels among five levels that the PAM-5 signal may have.

On the other hand, the receiver may receive a single-ended PAM-5 signal, and may generate differential PAM-5 signals VSP and VSN based on the single-ended PAM-5 signal. In each of the positive signal VSP and the negative signal VSN, the medium level M may have a value close to the DC level.

Similar to that described with reference to FIGS. 5A, 5B, and 6A to 6C, the waveforms of the differential PAM-5 signals VSP and VSN may be modified by the DFE. Even when the differential signal generator does not have an offset, there are cases in which the comparison result of the positive signal VSP and the negative signal VSN having the medium level M has a specific level.

According to an example embodiment, the offset detector circuit may determine whether the differential signal generator has an offset depending on whether in a given signal pattern of a single-ended PAM-5 signal VRX, the comparison result of the positive signal VSP and the negative signal VSN conforms to a predetermined offset pattern.

Figure 10A:
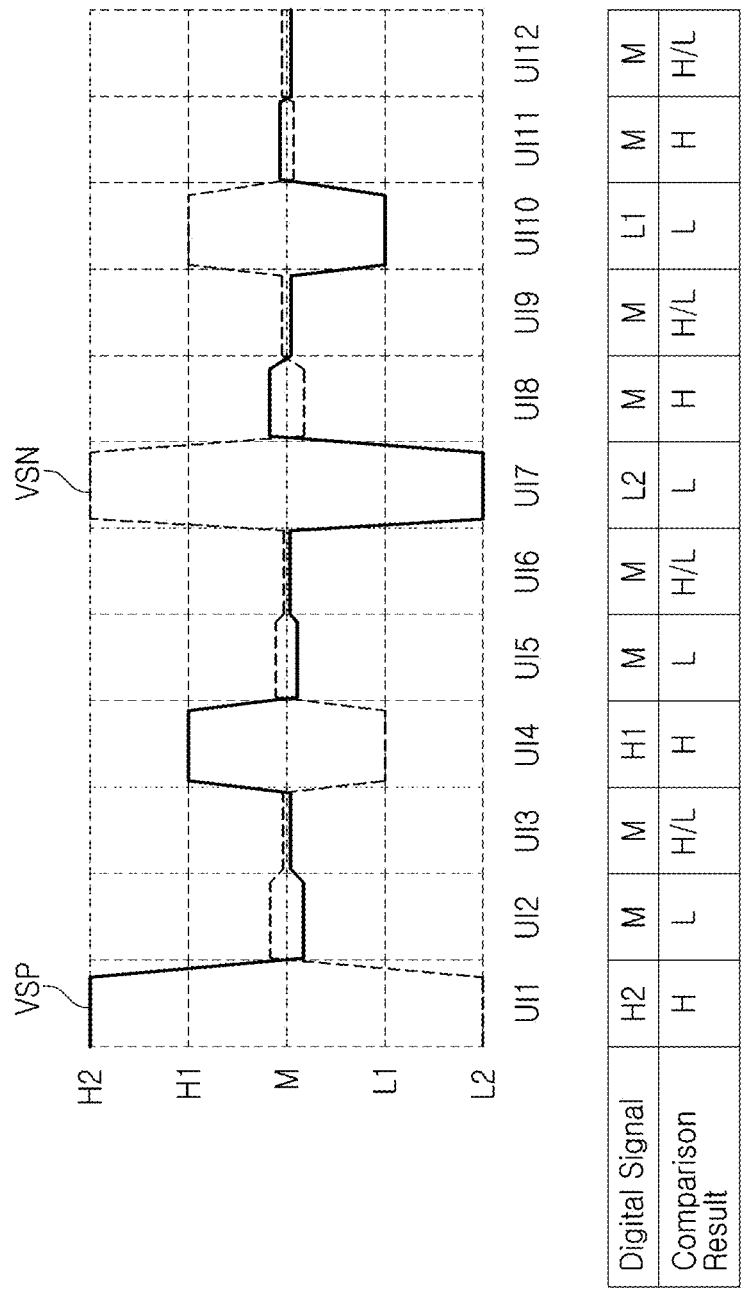
FIGS. 10A to 10C are diagrams illustrating, in detail, a method of detecting an offset of a differential signal generator according to example embodiments.

FIG. 10A illustrates a comparison result of a positive signal VSP and a negative signal VSN according to a pattern of a digital signal when the differential signal generator does not have an offset.

Referring to FIG. 10A, a digital signal determined based on a single-ended PAM-5 signal VRX may have a pattern of H2-M-M-H1-M-M-L2-M-M-L1-M-M. Due to the operation of the DFE, when a digital signal changes from high level H2 or H1 to medium level M or from low level L2 or L1 to medium level M, waveforms of the differential signals VSP and VSN may be modified. Therefore, when the signal pattern of the digital signal is H1-M-M or H2-M-M, a comparison result of the positive signal VSP and the negative signal VSN may have a pattern of H-L-H or H-L-L. In addition, when the signal pattern of the digital signal is L1-M-M or L2-M-M, the comparison result of the positive signal VSP and the negative signal VSN may have a pattern of L-H-H or L-H-L.

Figure 10B:
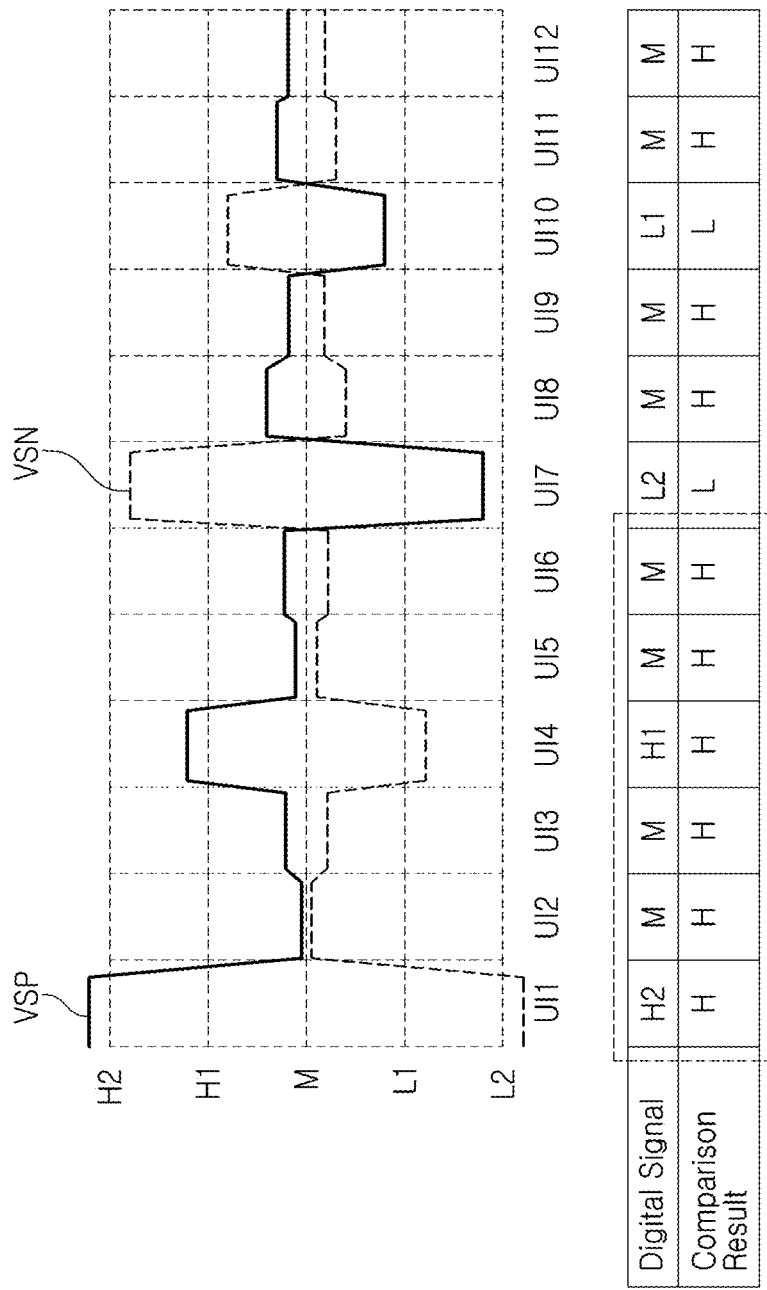

FIG. 10B illustrates a comparison result of the positive signal VSP and the negative signal VSN according to the pattern of the digital signal in the case in which the differential signal generator has a positive offset.

Referring to FIG. 10B, the medium level M of the positive signal VSP may be higher than the medium level M of the negative signal VSN. In detail, in the second and fifth signal periods UI2 and UI5, unlike the case in which the differential signal generator does not have an offset, the signal as a result of comparison between the positive signal VSP and the negative signal VSN may have a high level H. For example, when the differential signal generator has a positive offset, the comparison result signal may have an H-H-H pattern when the digital signal has a pattern of H1-M-M or H2-M-M.

Figure 10C:
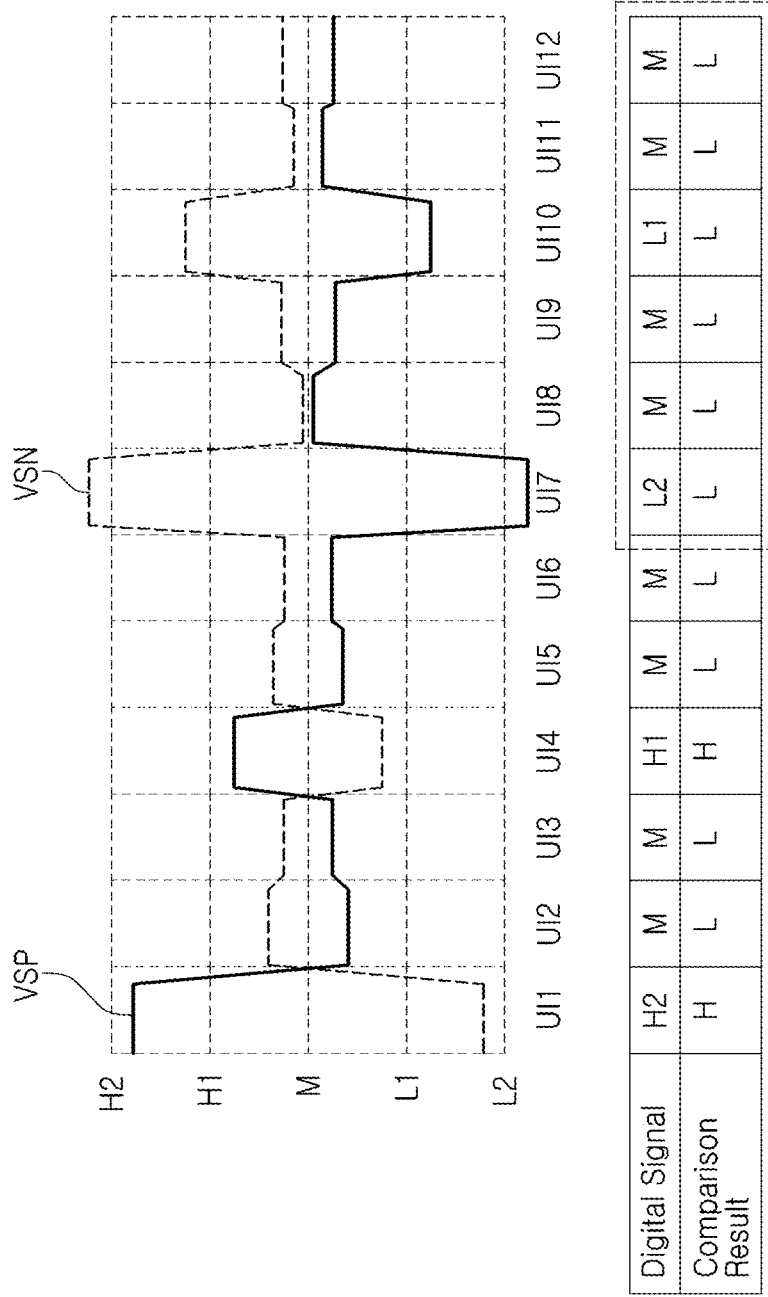

FIG. 10C illustrates a comparison result of a positive signal VSP and a negative signal VSN according to a pattern of a digital signal when the differential signal generator has a negative offset.

Referring to FIG. 10C, the medium level M of the positive signal VSP may be lower than the medium level M of the negative signal VSN. In detail, in the eighth and eleventh signal periods UI8 and UI11, the signal as a result of comparison between the positive signal VSP and the negative signal VSN may have a low level L, unlike the case in which the differential signal generator does not have an offset. For example, when the differential signal generator has a negative offset and the digital signal has a pattern of L1-M-M or L2-M-M, the comparison result signal may have an L-L-L pattern.

According to an example embodiment, when the offset detector circuit detects that the digital signal generated based on the single-ended PAM-5 signal has a predetermined signal pattern, it is checked whether a signal as a result of comparison between the positive signal VSP and the negative signal VSN has an offset pattern. Based on the check result, it may be determined whether the differential signal generator has a positive offset, a negative offset, or no offset. In addition, the offset compensator may adjust the levels of the reference signal Vref and the compensation signals VCP and VCN applied to the differential signal generator according to the determination result.

Figure 11A:
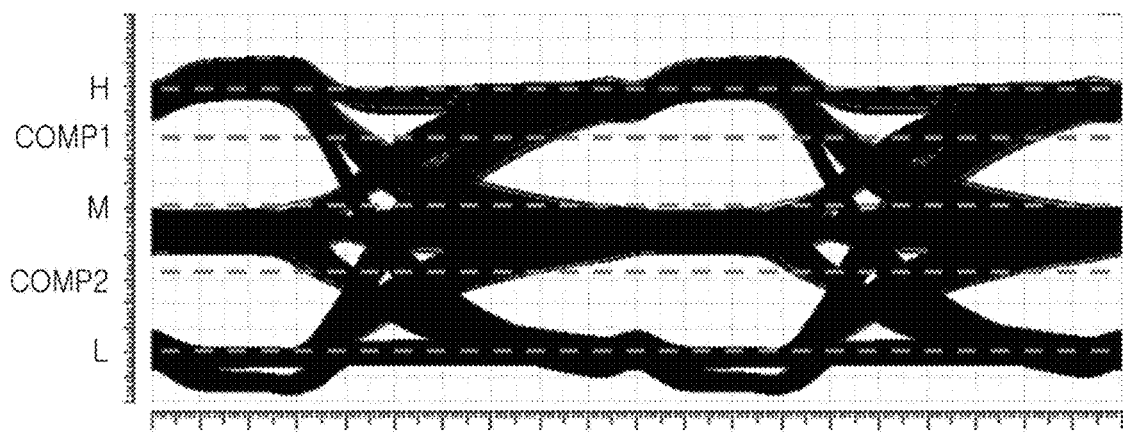
FIGS. 11A to 11D are eye diagrams to compare and illustrate effects according to comparative examples and example embodiments of the present inventive concept.
Figure 11B:
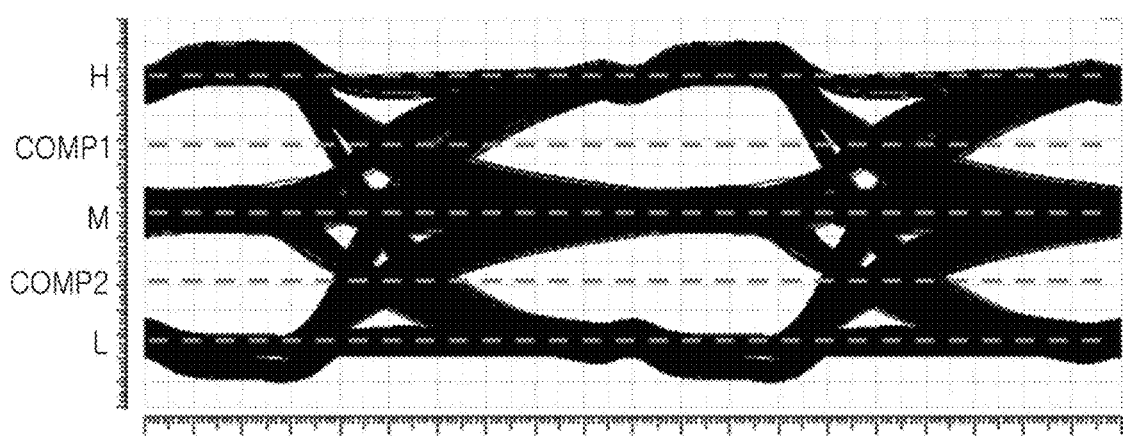

FIGS. 11A to 11B are eye diagrams to compare and illustrate effects according to a comparative example and an example embodiment when the differential signal generator has a negative offset. FIGS. 11A and 11B illustrate the signal levels H, M, L and comparison levels COMP1, COMP2 that the PAM-3 signal may have in one signal period.

FIG. 11A illustrates an eye diagram of a differential PAM-3 signals VSP and VSN according to a comparative example. In the eye diagram of FIG. 11A, the distribution of signals corresponding to the medium level M may have a distribution biased toward the second comparison level COMP2, when compared with the ideal medium level M illustrated in FIG. 11B. According to the comparative example, an error in which signals corresponding to medium level M are incorrectly determined as low level L signals in the receiver may frequently occur.

FIG. 11B illustrates an eye diagram of a differential PAM-3 signals VSP and VSN according to an example embodiment. In the eye diagram of FIG. 11B, the distribution of the differential PAM-3 signals VSP and VSN may be distributed around ideal signal levels H, M, and L. Thus, the signal levels of the differential PAM-3 signals VSP and VSN may be clearly distinguished by the comparison levels COMP1 and COMP2, and error occurrence in the receiver may be mitigated.

Figure 11C:
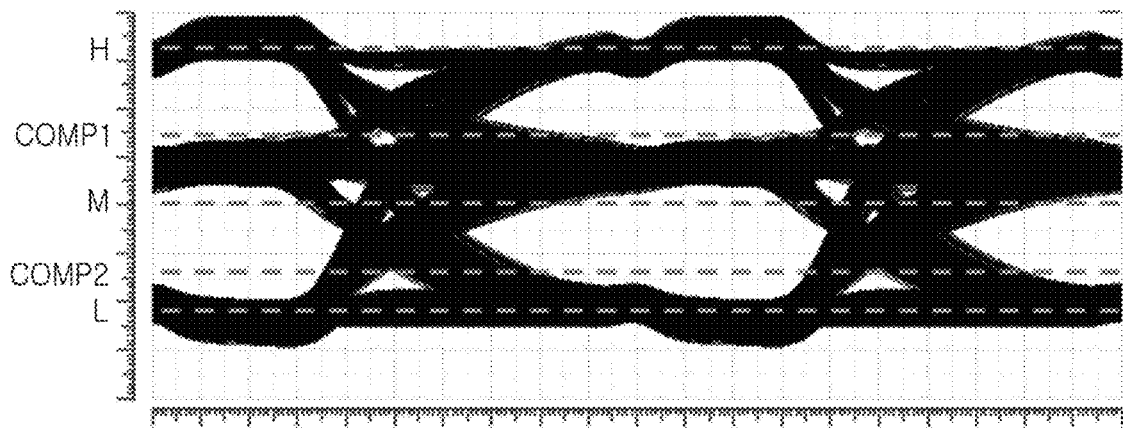
Figure 11D:
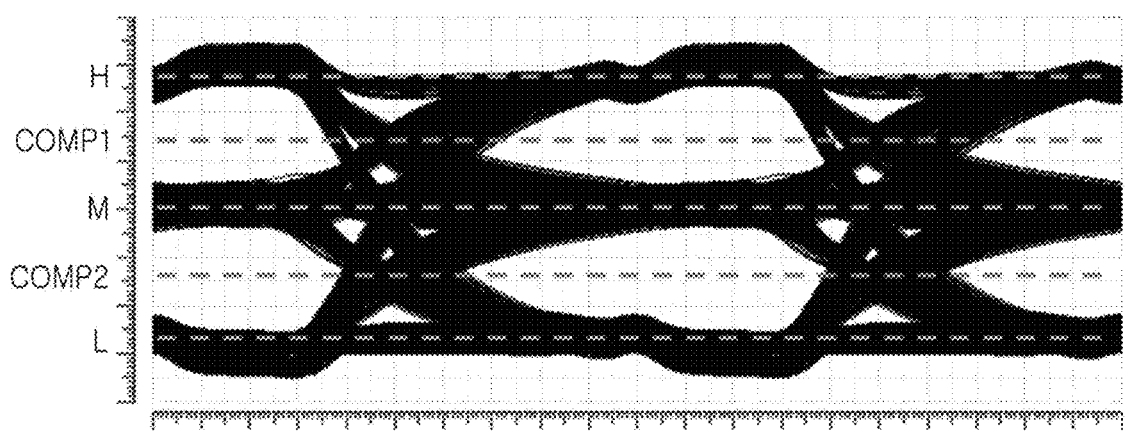

FIGS. 11C and 11D are eye diagrams to compare and illustrate effects according to a comparative example and an example embodiment when the differential signal generator has a positive offset. FIGS. 11C and 11D illustrate the signal levels H, M and L and comparison levels COMP1 and COMP2 that the PAM-3 signal may have in one signal period.

FIG. 11C illustrates an eye diagram of a differential PAM-3 signals VSP and VSN according to a comparative example. In the eye diagram of FIG. 11C, the distribution of signals corresponding to the medium level M may have a distribution biased to the first comparison level COMP1, when compared with the ideal medium level M illustrated in FIG. 11D. According to the comparative example, an error that signals corresponding to the medium level M are erroneously determined as high-level H signals in the receiver may frequently occur.

FIG. 11D illustrates an eye diagram of differential PAM-3 signals VSP and VSN according to an example embodiment. Similar to the eye diagram of FIG. 11D, the distribution of the differential PAM-3 signals VSP and VSN may be distributed around ideal signal levels H, M and L.

According to an example embodiment, the receiver detects the offset when the differential signal generator has a positive offset or a negative offset, and may compensate for the offset of the differential signal generator.

Figure 12A:
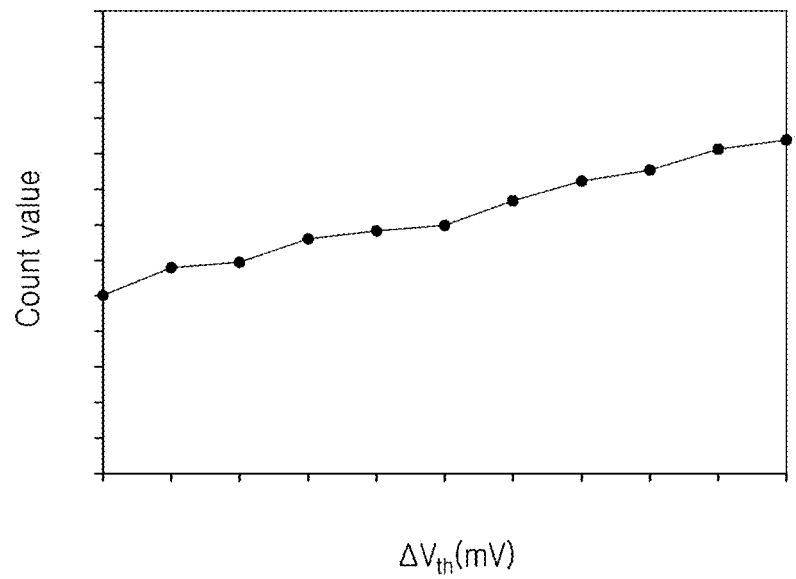
FIGS. 12A to 12C are diagrams illustrating effects according to example embodiments.
Figure 12B:
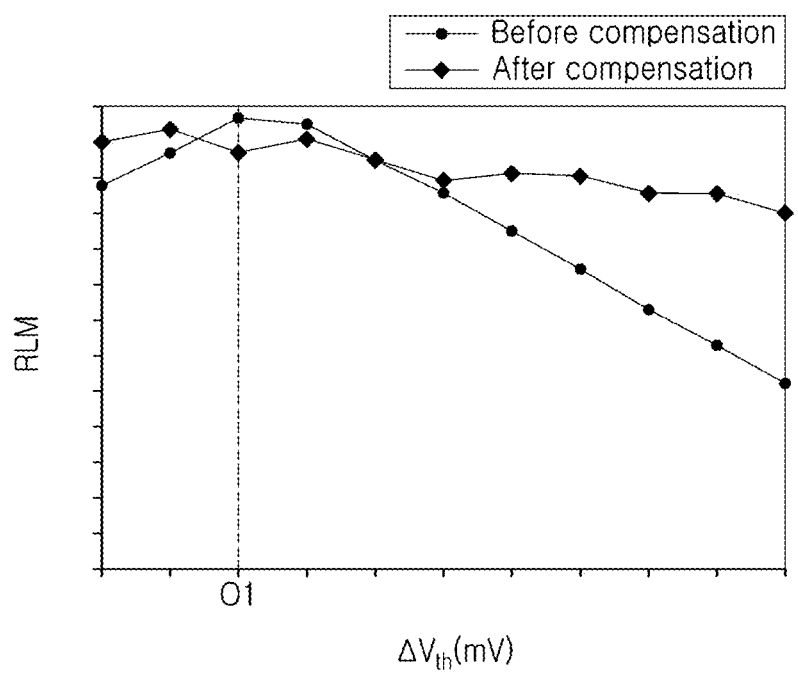
Figure 12C:
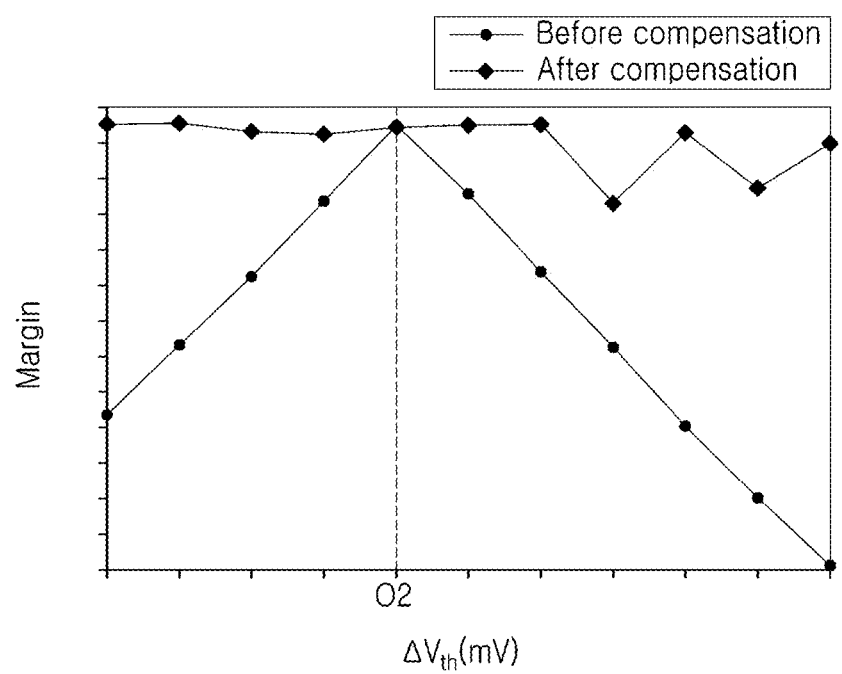

FIGS. 12A to 12C are graphs illustrating the effect according to example embodiments.

FIG. 12A illustrates a count value determined by an up/down counter according to an offset value ΔVth of a differential signal generator. In FIG. 12A, a positive offset value may generate a positive offset voltage in the differential signals VSP and VSN, and a negative offset value may generate a negative offset voltage in the differential signals VSP and VSN.

In the example of FIG. 12A, the count value may increase according to the offset value ΔVth of the differential signal generator. For example, as the offset value ΔVth has a greater value in the positive direction, the reference voltage Vref and the negative compensation voltage VCN are adjusted to decrease and the positive compensation voltage VCP is adjusted to increase, and thus, the offset of the differential signals VSP and VSN may be compensated.

FIG. 12B illustrates the RLM before and after offset compensation according to an example embodiment, according to the offset value ΔVth of the differential signal generator.

The larger the margin between adjacent signal levels and the more even the margins are, the more accurately the signal levels may be distinguished. The degree to which the margins between adjacent signal levels are even may be referred to as RLM.

RLM before offset compensation has a maximum value when the offset value ΔVth has a specific value O1, and the RLM may be significantly reduced when the offset value ΔVth deviates from the specific value O1. On the other hand, according to an example embodiment, since the reference voltage Vref and the compensation voltages VCN and VCP may be adjusted according to the offset value, the RLM after offset compensation may remain high regardless of the offset value ΔVth of the differential signal generator. For example, in the PAM-3 signaling method, RLM=1 indicates that two eyes are equally spaced and RLM=0 indicates that at least one of the two eyes has collapsed.

FIG. 12C illustrates a margin before and after offset compensation according to an example embodiment, according to an offset value ΔVth of a differential signal generator.

The margin before offset compensation has a maximum value when the offset value ΔVth has a specific value O2, and the margin may be significantly reduced when the offset value ΔVth deviates from the specific value O2. On the other hand, since the reference voltage Vref and the compensation voltages VCN and VCP may be adjusted according to the offset value, the margin after offset compensation may be maintained in a high state regardless of the offset value ΔVth of the differential signal generator.

To sum up, according to example embodiments, the offset voltages of the differential signals VSP and VSN may be effectively reduced regardless of the offset value of the differential signal generator. For example, the offset of the differential signal generator may be compensated, and the margin and RLM of the receiver may be improved.

As set forth above, according to example embodiments, the offset detector circuit according to an example embodiment may determine whether the differential signal generator has a positive offset or a negative offset, based on a predetermined data pattern of a single-ended PAM-N (N is an odd number) signal and a comparison result pattern of the differential PAM-N signal.

The offset detector circuit according to an example embodiment may detect the offset of the differential signal generator by detecting the predetermined data pattern from the received data pattern, and thus, may detect the offset of the differential signal generator without separately receiving a test data pattern.

A receiver according to an example embodiment may detect an offset of the differential signal generator and adjust the levels of a reference signal and compensation signals used by the differential signal generator to generate the differential signal according to the detected offset, thereby compensating for an offset of the differential signal generator.

While example embodiments have been illustrated and described above, it will be apparent to those skilled in the art that modifications and variations could be made without departing from the scope of the present inventive concept as defined by the appended claims.

What is claimed is:

1. An offset detector circuit, comprising:
a digital signal register configured to store M unit digital signals received in latest M signal periods, where M is a natural number, among digital signals generated based on an externally received single-ended Pulse Amplitude Modulation (PAM)-N signal, where N is an odd number;
a comparator configured to output comparison signals of a positive signal and a negative signal included in differential signals generated from a differential signal generator based on the single-ended PAM-N signal;
a comparison result register configured to store M unit comparison signals corresponding to the latest M signal periods among the comparison signals;
a pattern detector configured to output a detection signal when the M unit digital signals match a predetermined signal pattern; and
an offset checker configured to check patterns of the M unit comparison signals in response to the detection signal, and output an offset detection signal when the patterns of the M unit comparison signals match a predetermined offset pattern.

2. The offset detector circuit of claim 1, wherein each of the M unit digital signals has one of a high level, a medium level and a low level, and
wherein the pattern detector is configured to output the detection signal when the M unit digital signals have high level-medium level-medium level patterns in order.

3. The offset detector circuit of claim 2, wherein each of the M unit comparison signals has one of a high level and a low level, and
wherein the offset checker is configured to output the offset detection signal when the M unit comparison signals have high level-high level-high level patterns in order.

4. The offset detector circuit of claim 3, wherein the offset detection signal is a positive offset detection signal indicating that a direct current (DC) level of the positive signal included in the differential signals is higher than a DC level of the negative signal included in the differential signals.

5. The offset detector circuit of claim 1, wherein each of the M unit digital signals has one of a high level, a medium level and a low level, and
wherein the pattern detector is configured to output the detection signal when the M unit digital signals have low level-medium level-medium level patterns in order.

6. The offset detector circuit of claim 5, wherein each of the M unit comparison signals has one of a high level and a low level, and
wherein the offset checker is configured to output the offset detection signal when the M unit comparison signals have low level-low level-low level patterns in order.

7. The offset detector circuit of claim 6, wherein the offset detection signal is a negative offset detection signal indicating that a DC level of the positive signal included in the differential signals is lower than a DC level of the negative signal included in the differential signals.

8. The offset detector circuit of claim 1, wherein the comparator includes a plurality of unit comparators, and
wherein each of the plurality of unit comparators is configured to receive the positive signal included in the differential signals and the negative signal included in the differential signals, and alternately generate comparison results in every signal period.

9. A receiver comprising:
a differential signal generator configured to receive a single-ended Pulse Amplitude Modulation (PAM)-N signal, where N is an odd number, and generate differential signals based on the single-ended PAM-N signal, a reference signal, and a pair of compensation signals;
an offset detector circuit configured to detect a predetermined signal pattern from a digital signal determined based on the single-ended PAM-N signal, and generate an offset detection signal when a comparison result signal of a positive signal and a negative signal included in the differential signals in signal periods corresponding to the predetermined signal pattern matches a predetermined offset pattern; and
an offset compensator configured to adjust signal levels of the reference signal and the pair of compensation signals in response to the offset detection signal, and provide the reference signal and the pair of compensation signals having adjusted levels to the differential signal generator.

10. The receiver of claim 9, wherein the differential signal generator includes:

a single-ended to differential (S2D) converter configured to convert a main signal having the same phase as a phase of the single-ended PAM-N signal and an inverted signal obtained by inverting a phase of the main signal based on the reference signal;

a differential amplifier configured to amplify the main signal and the inverted signal;

a Decision Feedback Equalizer (DFE) configured to remove an influence of Inter-Symbol Interference (ISI) expected according to a signal level of the amplified main signal and the amplified inverted signal in a previous signal period, from the main signal and the inverted signal in a current signal period; and a differential compensator configured to generate the differential signals by applying the pair of compensation signals to the main signal and the inverted signal from which the influence of the ISI has been removed.

11. The receiver of claim 10, wherein the offset detector circuit is configured to generate the offset detection signal when the comparison result signal is maintained at a high level in signal periods in which the digital signal has a signal pattern falling from a high level to a medium level.

12. The receiver of claim 11, wherein the offset compensator is configured to adjust a level of the reference signal to increase in response to the offset detection signal.

13. The receiver of claim 11, wherein the offset compensator is configured to adjust a level of a negative compensation signal corresponding to the negative signal among the pair of compensation signals to decrease, and adjust a level of a positive compensation signal corresponding to the positive signal among the pair of compensation signals to increase.

14. The receiver of claim 10, wherein the offset detector circuit is configured to generate the offset detection signal when the comparison result signal is maintained at a low level in signal periods in which the digital signal has a signal pattern rising from a low level to a medium level.

15. The receiver of claim 14, wherein the offset compensator is configured to adjust a level of the reference signal in response to the offset detection signal to decrease.

16. The receiver of claim 14, wherein the offset compensator is configured to adjust a level of a negative compensation signal corresponding to the negative signal among the pair of compensation signals to decrease, and adjust a level of a positive compensation signal corresponding to the positive signal among the pair of compensation signals to increase.

17. The receiver of claim 9, wherein the offset compensator includes:

an up-down counter configured to increase or decrease a count value based on the offset detection signal;

a first Digital-to-Analog Converter (DAC) configured to output the reference signal based on the count value; and a second DAC configured to output the pair of compensation signals based on the count value.

18. The receiver of claim 17, wherein the count value has K bit value, where K is a natural number, and wherein in the K bit value, an upper L bit value, where L is a natural number, is input to the first DAC to determine the reference signal, and a lower (K-L) bit value is input to the second DAC to determine the pair of compensation signals.

19. The receiver of claim 9, further comprising:

a counter configured to count a number of detections whenever the offset detector circuit detects the predetermined signal pattern, and provide an end signal to the offset detector circuit when the number of detections reaches a threshold value.

20. A method of compensating for an offset of a differential signal generator, the method comprising:

receiving a single-ended pulse amplitude modulation (PAM)-N signal, where N is an odd number;

generating differential signals based on the single-ended PAM-N signal, a reference signal, and a pair of compensation signals;

generating a comparison result signal of a positive signal and a negative signal included in the differential signals;

generating a digital signal based on the single-ended PAM-N signal;

detecting a predetermined signal pattern from the digital signal;

adjusting a count value according to whether the comparison result signal corresponding to the detected signal pattern matches a predetermined offset pattern; and adjusting the reference signal or the pair of compensation signals based on the count value.

\* \* \* \* \*